ctor regions, respectively. First and second semiconductor island regions are formed to be buried in a second insulator formed on a first insulator. First and second bipolar transistors are provided in the first and second island regions, respectively. An interconnection conductor for electrically interconnecting collector regions of the first and second transistors is formed in the second insulator and in contact with the collector regions of the first and second transistors. A common collector electrode formed on a third insulator covering the first and second island regions is electrically connected with the collector regions of the first and second transistors through the interconnection conductor, respectively.

United States Patent [19]
Morikawa

[11] Patent Number: 5,552,626
[45] Date of Patent: Sep. 3, 1996

[54] SEMICONDUCTOR DEVICE HAVING BIPOLAR TRANSISTORS WITH COMMONLY INTERCONNECTED COLLECTOR REGIONS

[75] Inventor: Takenori Morikawa, Tokyo, Japan

[73] Assignee: NEC Corporation, Tokyo, Japan

[21] Appl. No.: 330,588

[22] Filed: Oct. 28, 1994

[30] Foreign Application Priority Data

Oct. 28, 1993 [JP] Japan .................... 5-291558

[51] Int. Cl.$^6$ .................................. H01L 29/732
[52] U.S. Cl. .................... 257/525; 257/566; 257/508; 257/526
[58] Field of Search ................... 257/525, 566, 257/574, 560, 563, 564, 587, 508, 574, 524, 526

[56] References Cited

U.S. PATENT DOCUMENTS

| 4,338,622 | 7/1982 | Fent et al. | 257/754 |
| 4,492,008 | 1/1985 | Anantha et al. | 257/511 |
| 4,982,262 | 1/1991 | Hartman et al. | 257/563 |
| 5,345,102 | 9/1994 | Matsumoto | 257/587 |

OTHER PUBLICATIONS

"Integrated Complementary HBT Microwave Push–Pull and Darlington Amplifiers with p–n–p Active Loads", by K. Kobayashi et al., IEEE Jrnl. of Solid–State Cir., vol. 28, No. 10, Oct. 93, pp. 1011–1017.

"An NPN 30 GHZ, PNP 32 GHz $F_T$ Complementary Bipolar Technology", by T. Onai et al., 1993 IEEE, IEDM 93–66.

Primary Examiner—Robert P. Limanek
Assistant Examiner—David B. Hardy
Attorney, Agent, or Firm—Popham, Haik, Schnobrich & Kaufman, Ltd.

[57] ABSTRACT

A semiconductor device with bipolar transistors formed in respective island regions in which collector regions of the bipolar transistors do not need to be pulled up to the top of the corresponding island regions and do not need to be contacted with a collector electrode on the top of the corresponding island regions. First and second semiconductor island regions are formed to be buried in a second insulator formed on a first insulator. First and second bipolar transistors are provided in the first and second island regions, respectively. An interconnection conductor for electrically interconnecting collector regions of the first and second transistors is formed in the second insulator and in contact with the collector regions of the first and second transistors. A common collector electrode formed on a third insulator covering the first and second island regions is electrically connected with the collector regions of the first and second transistors through the interconnection conductor, respectively.

23 Claims, 10 Drawing Sheets

SEMICONDUCTOR DEVICE HAVING BIPOLAR TRANSISTORS WITH COMMONLY INTERCONNECTED COLLECTOR REGIONS

BACKGROUND OF THE INVENTION

1. Field of the Invention

The present invention relates to a semiconductor device and more particularly, to a semiconductor device containing bipolar transistors formed on an insulator such as an insulating substrate, and an insulating film provided on a semiconductor substrate.

2. Description of the Prior Art

Figure 3A:
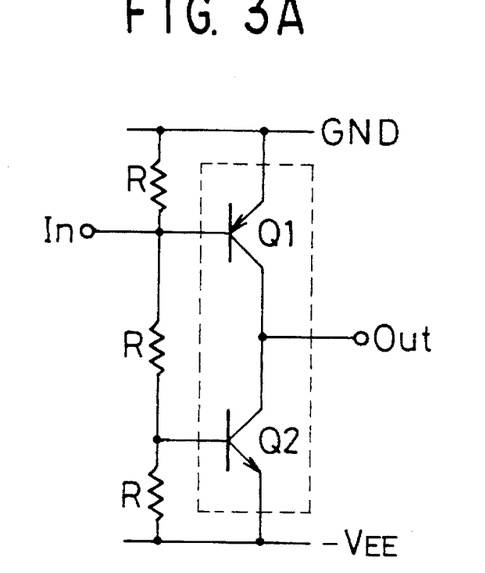
FIG. 3A shows a complementary bipolar transistor circuit.
Figure 3B:
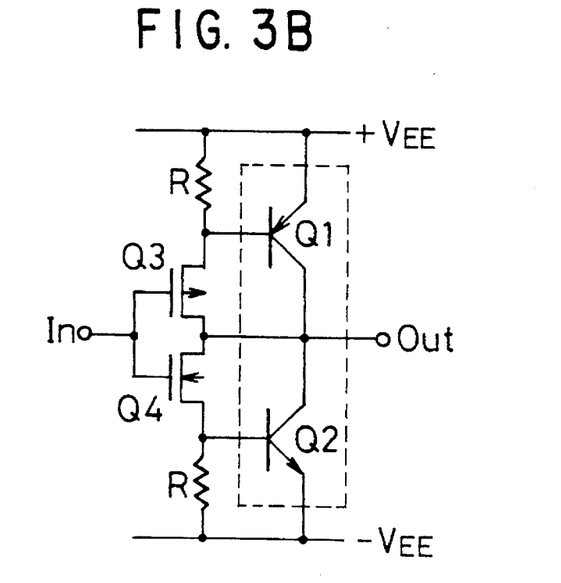
FIG. 3B shows another complementary bipolar transistor circuit.

Conventional complementary bipolar transistor circuits are shown in FIGS. 3A and 3B. The transistors are employed not only in digital signal applications but also in analog signal application.

In FIGS. 3A and 3B, the reference characters Q1 and Q2 show pnp and npn bipolar transistors, Q3 and Q4 show p- and n-channel metal-oxide-semiconductor (MOS) transistors. R shows resistors, and In and Out show input and output ends, respectively. $+V_{EE}$ and $-V_{EE}$ shows power source voltages.

with the complementary bipolar transistor circuits as described above, when high-speed operations are necessary, a silicon-on-insulator (SOI) structure has been employed because of less stray capacitance.

Figure 1A:
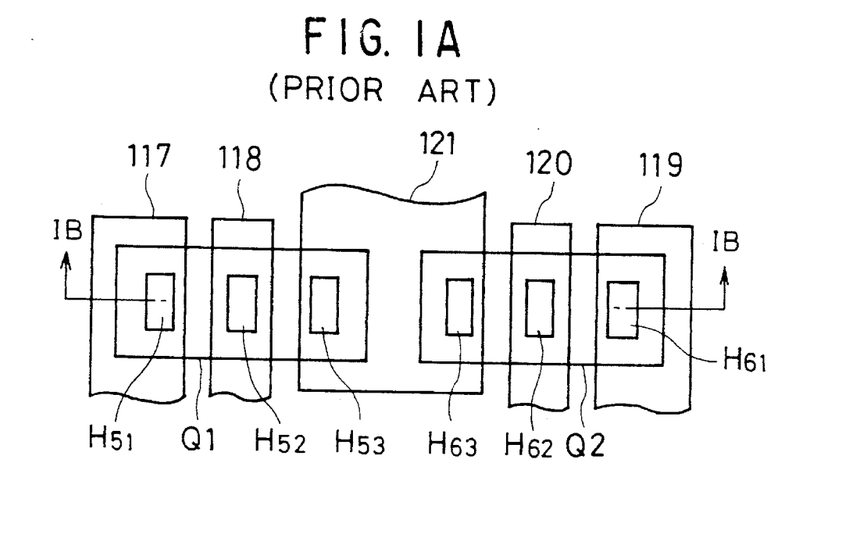
FIG. 1A is a partial plan view of a conventional semiconductor device.
Figure 1B:
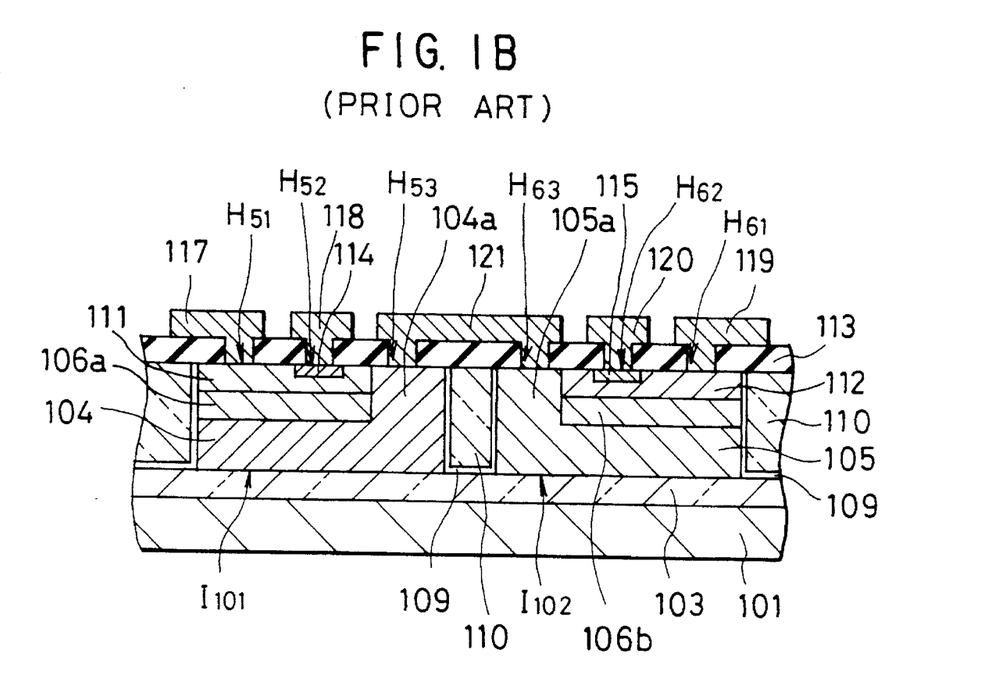
FIG. 1B is a cross section along the line IB—IB in FIG. 1A.

FIGS. 1A and 1B show a conventional semiconductor device of SOI structure including high-speed complementary bipolar transistor circuits. FIG. 1A is a plan view of the portion surrounded by a broken line in FIGS. 3A and 3B. FIG. 1B is a cross section along the line IB-IB in FIG. 1A.

As shown in FIG. 1B, a silicon dioxide ($SiO_2$) film 103 is formed on a silicon substrate 101. First and second island regions $I_{101}$ and $I_{102}$ are formed on the film 103. The first and second island regions $I_{101}$ and $I_{102}$ are buried in a silicon nitride ($Si_3N_4$) film 109 and a boron-doped phosphosilicate glass (BPSG) film 110 stacked on the silicon dioxide film 103. A silicon dioxide film 113 for masking is formed to cover the first and second island regions $I_{101}$ and $I_{102}$, the silicon nitride film 109 and the BPSG film 110.

The first and second island regions $I_{101}$ and $I_{102}$ are produced by patterning an $n^-$-type silicon substrate provided on the silicon dioxide film 103. The pnp and npn transistors Q1 and Q2 are formed in the first and second island regions $I_{101}$ and $I_{102}$, respectively.

In the first island region $I_{101}$, the pnp transistor Q1 has a $p^+$-type collector region 104, an epitaxial region 106a, an $n^+$-type base region 111 and a $p^+$-type emitter region 114. The base region 111 is electrically connected with a base electrode 117 through a base opening or hole $H_{51}$ of the mask dioxide film 113, and the emitter region 114 is electrically connected with an emitter electrode 118 through an emitter opening or hole $H_{52}$ of the fill 113.

Similarly, in the second island region $I_{102}$, the npn transistor Q2 has an $n^+$-type collector region 105, an epitaxial region 106b, a $p^+$-type base region 112 and an $n^+$-type emitter region 115. The base region 112 is electrically connected with a base electrode 119 through a base opening or hole $H_{61}$ of the mask dioxide fill 113, and the emitter region 115 is electrically connected with an emitter electrode 120 through an emitter opening or hole $H_{62}$ of the film 113.

The collector regions 104 and 105 of the transistors Q1 and Q2 have pull-up portions 104a and 105a extending to the tops of the island regions $I_{101}$ and $I_{102}$, respectively. The pull-up portions 104a and 105a are in contact with a common collector electrode 121 through collector openings or holes $H_{53}$ and $H_{63}$ of the fill 113, respectively. Thus, the collector regions 104 and 105 are electrically connected with the common collector electrode 121.

With the conventional semiconductor device described above, to connect with the collector electrode 121, the $p^+$ and $n^+$-type collector regions 104 and 105 need to be pulled up to the tops of the first and second island regions $I_{101}$ and $I_{102}$, and then, they need to be contacted with the collector electrode 121 at the tops of the island regions $I_{101}$ and $I_{102}$. Therefore, there is a limit in reducing device size or chip occupation area, which means that it is difficult to integrate the electronic circuits over the substrate 101 on a larger scale.

In addition, since reduction in contact area between the collector regions 104 and 105 and the collector electrode 121 increases the collector resistances of the transistors Q1 and Q2, impediments or hindrances tend to occur in circuit operation due to large output-level shifting. This leads to less reliability of the semiconductor device.

SUMMARY OF THE INVENTION

Accordingly, an object of the present invention is to provide a semiconductor device with bipolar transistors formed in respective island regions in which collector regions of the bipolar transistors do not need to be pulled up to the top of the corresponding island regions.

Another object of the present invention is to provide a semiconductor device with bipolar transistors formed in respective island regions in which collector regions of the bipolar transistors do not need to be contacted with a collector electrode on the top of the corresponding island regions.

Still another object of the present invention is to provide a semiconductor device with bipolar transistors formed in respective island regions in which the bipolar transistors cannot only operate at high-speed but also can be integrated on a larger scale than the conventional ones.

The semiconductor device according to the present invention contains a first insulator and a second insulator formed on the first insulator. A first semiconductor island region and a second semiconductor island region are formed to be buried in the second insulator. First and second bipolar transistors are provided in the first and second island regions, respectively.

There is an interconnection conductor for electrically interconnecting collector regions of the first and second transistors. The interconnection conductor is formed in the second insulator so that it is in contact with the collector regions of the first and second transistors.

A third insulator is formed to cover the first and second island regions and the second insulator. The third insulator has a collector opening.

A common collector electrode is formed on the third insulator and is electrically connected with the collector regions of the first and second transistors through the interconnection conductor.

With the semiconductor device according to the present invention, the interconnection conductor is provided in the second insulator so that it is in contact with the collector regions of the first and second transistors. Also, the common collector electrode is electrically connected with the collector regions through the interconnection conductor.

Therefore, the collector regions do not need to be pulled up to the top of the first and second island regions.

In addition, the collector regions do not need to be contacted with the common collector electrode on the top of the first and second island regions. This means that no pull-up portions are required for the collector regions in the first and second island regions.

As a result, the first and second bipolar transistors can be reduced in size so that they can be integrated on a larger scale than the conventional transistors.

Further, the collector resistances of the first and second transistors can be reduced because of the wide contact area between the collector regions and the interconnection conductor. At the same time, the stray capacitances of the first and second transistors are reduced due to their size reduction.

Accordingly, the first and second transistors can operate at high-speed.

The conductor is preferably made of refractory metal such as tungsten (W), tantalum (Ta), cobalt (Co) and titanium (Ti), or refractory metal compound such as titanium nitride (TiN), tungsten silicide ($WSi_2$), tantalum silicide ($TaSi_2$) and titanium tungstenide (TiW).

Preferably, the refractory metal and the refractory metal compounds for the conductor have melting points of 1400° C. or higher, since these materials are subjected to heat during the fabrication process sequence of the semiconductor device.

In a preferred embodiment, the interconnection conductor is placed at the boundary between the first and second island regions.

In another preferred embodiment, the interconnection conductor is formed to surround at least one of the first and second island regions.

In still another preferred embodiment, a contact conductor is provided in the second insulator to be in contact with the interconnection conductor and the collector electrode. In this case, the collector regions are electrically connected with the collector electrode through the interconnection conductor and the contact conductor.

The contact conductor also is preferably made of refractory metal or refractory metal compound such as those listed above.

DESCRIPTION OF THE PREFERRED EMBODIMENTS

Preferred embodiments of the present invention will be described below while referring to the drawings.

First Embodiment.

Figure 2A:
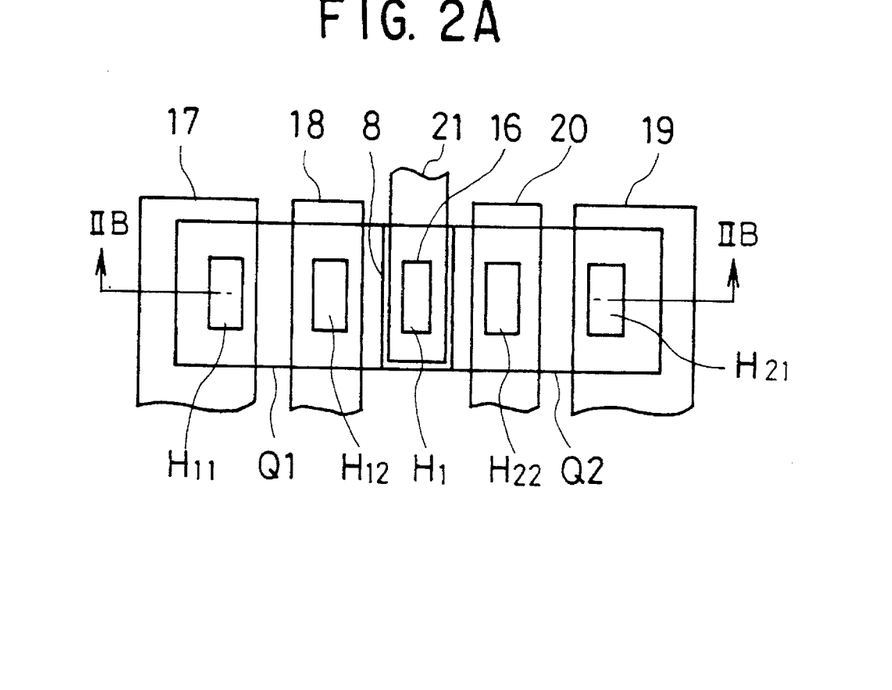
FIG. 2A is a partial plan view of a semiconductor device according to a first embodiment of the invention.
Figure 2B:
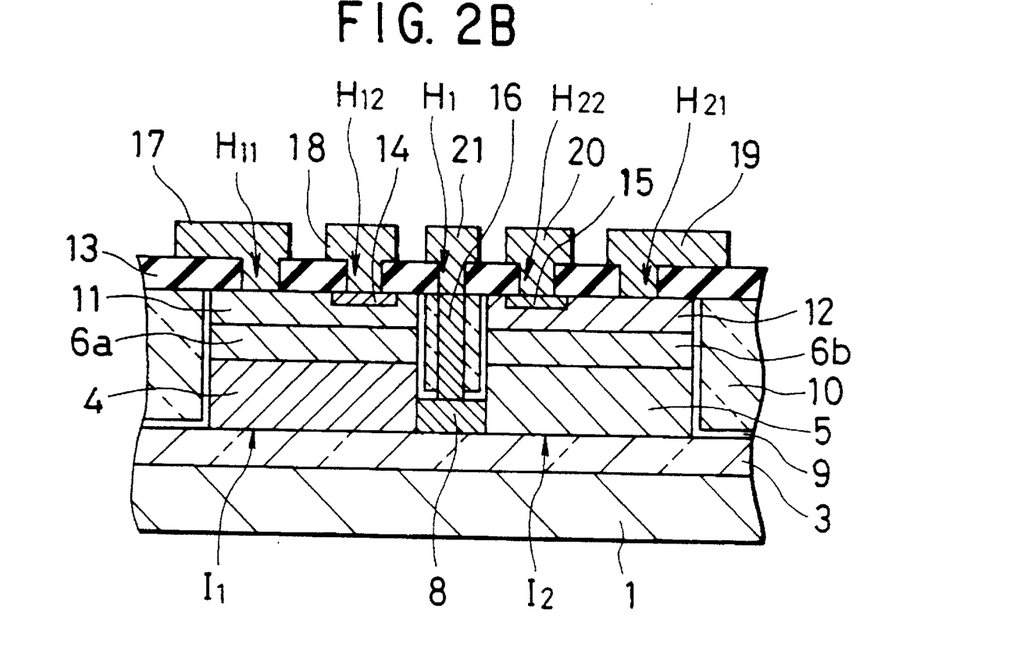
FIG. 2B is a cross section along the line IIB—IIB in FIG. 2A.

FIG. 2A shows a plan view of the portion surrounded by the broken line in FIGS. 3A and 3B, and FIG. 2B shows a cross section along the line IIB—IIB in FIG. 2A.

As shown in FIGS. 2A and 2B, a silicon dioxide film 3 is formed on a silicon substrate 1. First and second island regions $I_1$ and $I_2$ are formed on the film 3 to be buried in a silicon nitride film 9 and a BPSG film 10 that are stacked on the silicon dioxide film 3.

A silicon dioxide film 13 for masking is formed to cover the first and second island regions $I_1$ and $I_2$, the silicon nitride film 9 and the BPSG film 10.

The first and second island regions $I_1$ and $I_2$ are made by patterning an $n^-$-type silicon substrate formed on the insulator film 3. The pnp and npn transistors Q1 and Q2 are formed in the first and second island regions $I_1$ and $I_2$, respectively.

In the first island region $I_1$, the pnp transistor Q1 has a $p^+$-type collector region 4 formed on the silicon dioxide film 3, an epitaxial region 6a formed on the collector region 4, an $n^+$-type base region 11 formed on the epitaxial region 6a, and a $p^+$-type emitter region 14 formed in the base region 11.

The $n^+$-type base region 11 is electrically connected with a base electrode 17 through a base opening or hole $H_{11}$ of the mask dioxide film 13, and the emitter region 14 is electrically connected with an emitter electrode 18 through an emitter opening or hole $H_{12}$ of the film 13.

Similarly, in the second island region $I_2$, the transistor Q2 has an $n^+$-type collector region 5 formed on the silicon dioxide film 3, an epitaxial region 6b formed on the collector region 5, a $p^+$-type base region 12 formed on the epitaxial region 6b, and an $n^+$-type emitter region 15 formed in the base region 12.

The $p^+$-type base region 12 is electrically connected with a base electrode 19 through a base opening or hole $H_{22}$ of the mask dioxide film 13, and the emitter region 15 is electrically connected with an emitter electrode 20 through an emitter opening or hole $H_{22}$ of the film 13.

As shown in FIGS. 2A and 2B, the $p^+$- and $n^+$-type collector regions 4 and 5 of the transistors Q1 and Q2 are formed like flat sheets, and they do not have pull-up portions extending to the tops of the island regions $I_1$ and $I_2$, respectively.

A patterned tungsten (W) film 8 as an interconnection conductor is provided on the silicon nitride film 9 in the boundary between the first and second island regions $I_1$ and $I_2$. The interconnection conductor 8 is formed on the silicon dioxide film 3 to penetrate the boundary between the island regions $I_1$ and $I_2$. The conductor 8 extends from one end of the boundary to the other, that is, it extends over the common width of the transistors Q1 and Q2, as shown in FIG. 2A.

The collector regions 4 and 5 are in contact with the tungsten conductor 8 at areas along the boundary between the island regions $I_1$ and $I_2$, so that the collector regions 4 and 5 are electrically connected with each other through the conductor 8.

In the boundary between the island regions $I_1$ and $I_2$, a contact hole $H_1$ is formed vertically. The hole $H_1$ is extending from the top end of the tungsten conductor 8 to the top end of BPSG film 10 through the BPSG film 10 and the silicon nitride film 9 stacked.

A tungsten plug 16 as a contact conductor is formed in the contact hole $H_1$ so as to fill the hole $H_1$. The bottom end of the tungsten plug 16 is in contact with the tungsten interconnection conductor 8. Therefore, the $p^+$- and $n^+$-type collector regions are pulled up to the tops of the first and second island regions $I_1$ and $I_2$ through the tungsten interconnection conductor 8 and the tungsten contact conductor 16.

A collector electrode 21 is formed on the silicon dioxide film 13 for masking over the boundary between the island regions $I_1$ and $I_2$, and is in contact with the tungsten plug 16.

With the semiconductor device of the first embodiment as above, since the $p^+$- and $n^+$-type collector regions 4 and 5 of the transistors Q1 and Q2 do not need to have pull-up portions extending to the tops of the island regions $I_1$ and $I_2$, respectively, bipolar transistors Q1 and Q2 can be reduced in size so that they can be integrated on a larger scale than conventional transistors.

For example, the chip occupation area of this semiconductor device could be reduced in size to 70% of the conventional device shown in FIGS. 1A and 1B.

In addition, the collector regions 4 and 5 of the transistors Q1 and Q2 are in contact with the interconnection conductor 8 at their wide contact areas along the boundary between the island regions $I_1$ and $I_2$. In other words, the contact areas extend over the total width of the island regions $I_1$ and $I_2$. Also, the tungsten conductor 8 is electrically connected with the collector electrode 21 through the tungsten plug 16.

Therefore, the collector resistances of the transistors Q1 and Q2 can be reduced effectively. At the same time, the stray capacitances of the transistors Q1 and Q2 are also reduced due to their size reduction.

As a result, the transistors Q1 and Q2 can operate at high-speed.

For example, the stray capacitances could be reduced by 30% compared with that of the conventional device shown in FIGS. 1A and 1B.

The fabrication method of the semiconductor device of the first embodiment is shown referring to FIGS. 4A to 4D.

Figure 4A:
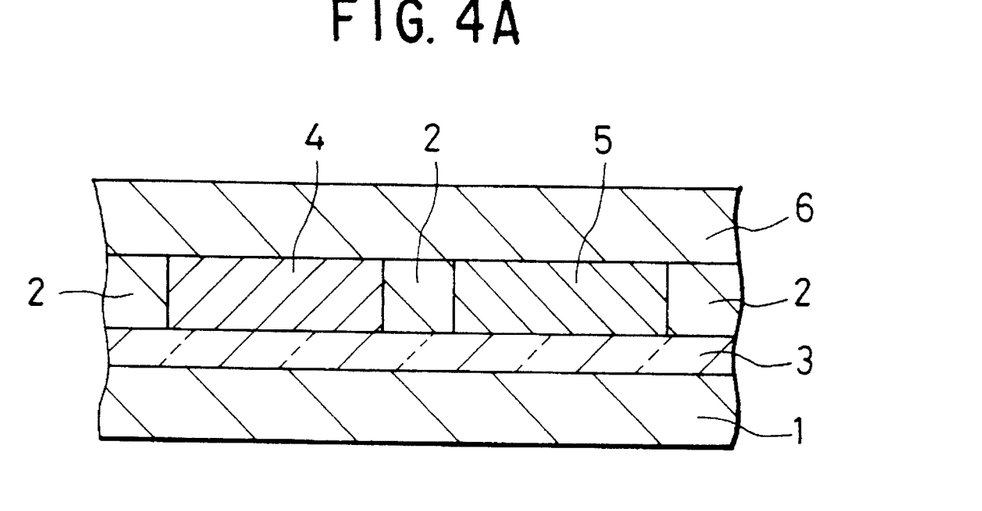
FIG. 4A to 4D are cross sections along the line IIB—IIB in FIG. 2A showing the fabrication method of the semiconductor device according to the first embodiment of the invention, respectively.

First, the silicon substrate 1 is prepared and the surface of the substrate 1 is flattened. An $n^-$-type silicon substrate 2 is prepared and then, a silicon dioxide ($SiO_2$) film 3 with a thickness of 1.5 µm is grown on the substrate 2 thermal oxidation.

Next, the substrate 2 is placed on the flattened surface of the substrate 1 so that the silicon dioxide film 3 is disposed between the substrates 1 and 2. The substrates 1 and 2 thus stacked are subjected to heat at 1100° C. for two hours so that they are coupled together. The substrate 2 thus coupled is then polished to about 1.5 µm in thickness.

Thus, as shown in FIG. 4A, the substrate 2 is supported by the substrate 1 through the silicon dioxide film 3, providing the so-called SOI structure.

Next, p- and n-type dopant ions are selectively implanted into the substrate 2, and the ions thus implanted are driven in the substrate 2 at a high temperature, producing a $p^+$-type collector region 4 and an $n^+$-type collector region 5 in the substrate 2 at an interval.

An $n^-$-type silicon is epitaxially grown on the ion-implanted substrate 2 to produce an $n^-$-type epitaxial layer 6. The state at this time is shown in FIG. 4A.

Figure 4B:
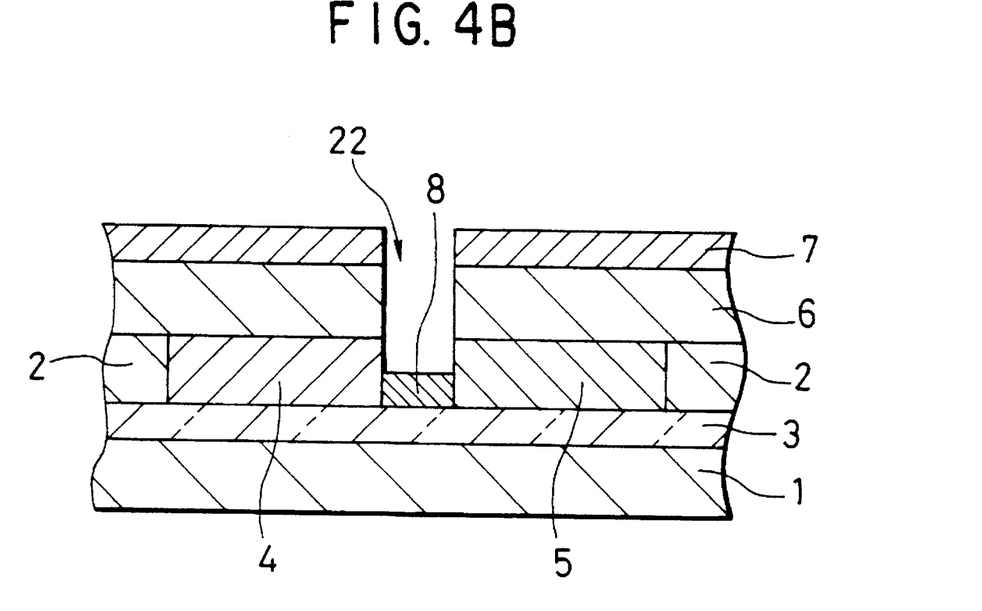

Subsequently, silicon nitride ($Si_2N_4$) is deposited by Chemical Vapor Deposition (CVD) on the epitaxial layer 6 over the substrate 1 to produce the silicon nitride film 7 for masking. The silicon nitride film 7 is patterned by photolithography and dry etching to produce a recess or groove 22 between the collector regions 4 and 5.

As shown in FIG. 4B, the recess or groove 22 vertically extends through the silicon nitride film 7, the epitaxial layer 6 and substrate 2 to reach the top of the silicon dioxide film 3. The groove 22 horizontally extends along the opposite faces of the collector regions 4 and 5 over the width of the regions 4 and 5.

Tungsten is then deposited by CVD to form a tungsten film 8 on the silicon nitride film 7. Through this CVD process, the groove 22 becomes filled with the tungsten film 8. The tungsten film 8 is then etched back so that the film 8 remains only in the groove 22. Thus, the tungsten film 8 acting as the interconnection conductor is selectively formed in the groove 22, as shown in FIG. 4B.

The remaining tungsten film 8 or the interconnection conductor has a thickness smaller than that of the collector regions 4 and 5.

Figure 4C:
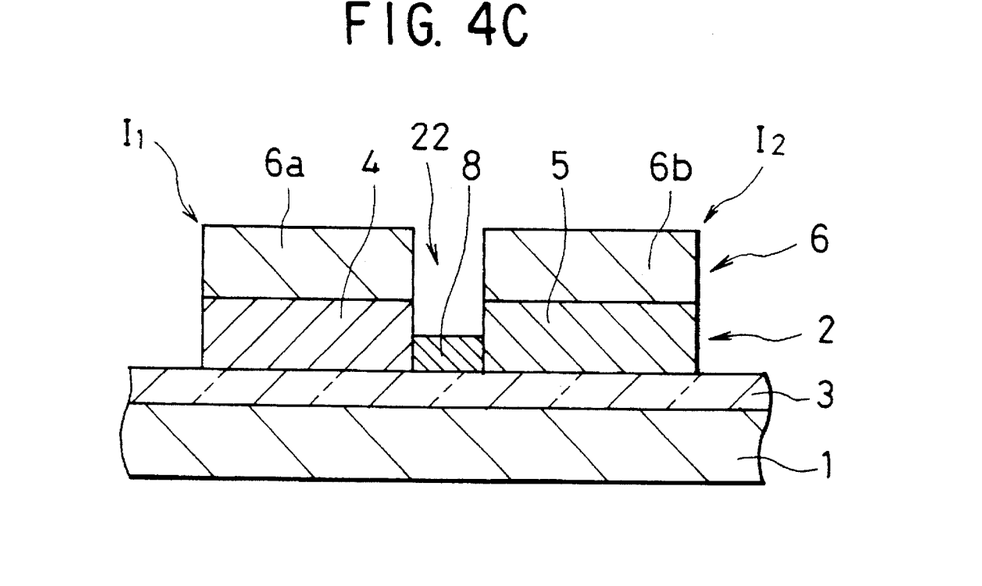

After the silicon nitride film 7 is removed, the epitaxial layer 6 and the $n^-$-type substrate 2 are selectively removed by photolithography and plasma etching. Thus, as shown in FIG. 4C, the first and second island regions $I_1$ and $I_2$ are produced on the silicon dioxide film 3 at an interval. At the same time, the epitaxial regions 6a and 6b are produced from the epitaxial layer 6 in the first and second island regions $I_1$ and $I_2$, respectively. The tungsten interconnection conductor 8 remains between the island regions $I_1$ and $I_2$, so that the collector regions 4 and 5 are electrically connected with each other through the conductor 8.

Subsequently, silicon nitride is deposited by CVD over the substrate 1; thus the exposed surfaces of the first and second island regions $I_1$ and $I_2$, the exposed surface of the interconnection conductor 8, and the silicon dioxide film 3 are covered with the silicon nitride film 9 with a thickness of 300 Å.

Figure 4D:
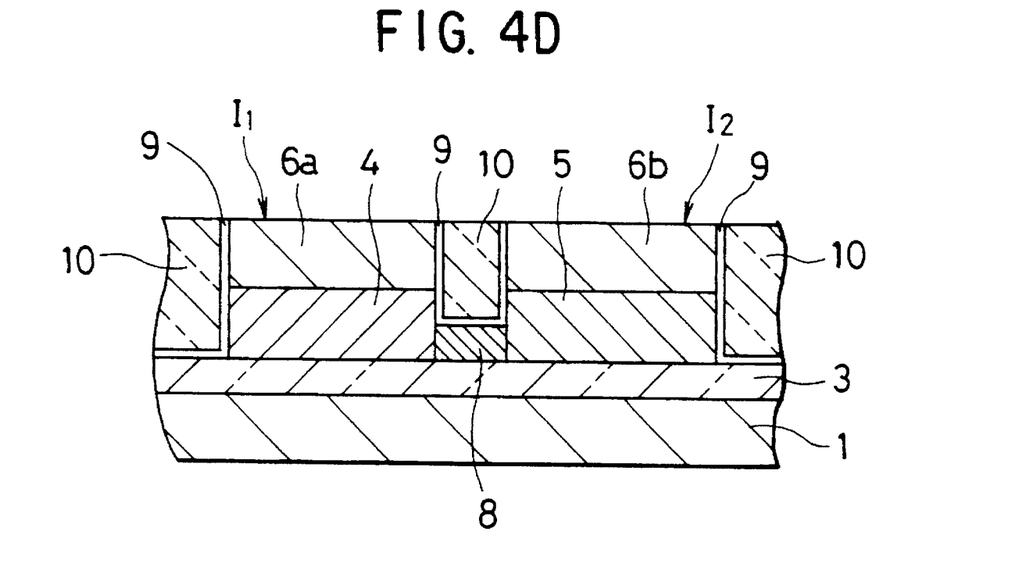

The BPSG film 10 is grown on the silicon nitride film 9 thus produced so that the first and second island regions $I_1$ and $I_2$ are buried in the BPSG film 10. The BPSG film 10 is then polished to be removed partially until the silicon nitride film 9 is exposed from the BPSG film 10 at the tops of the island regions $I_1$ and $I_2$.

The silicon nitride film 9 thus exposed is selectively removed by etching. Thus, as shown in FIG. 4D, the tops of the island regions $I_1$ and $I_2$ and those of their surrounding areas are exposed. Next, as shown in FIG. 2B, phosphorus (p) ions are selectively implanted into the epitaxial region 6a in the first island region $I_1$ to produce the $n^+$-type base region 11. Boron (B) ions are selectively implanted into the epitaxial region 6b in the second island region $I_1$ to produce the $p^+$-type base region 12.

After the masking dioxide film 13 is grown by CVD over the substrate 1, the base and emitter openings or holes $H_{11}$ and $H_{13}$ are formed in the film 13 over the $n^+$- and $p^+$-type base regions 11 and 12, respectively. Using the film 13 as a mask, phosphorus (P) ions are selectively implanted into the $n^+$-type base region 11 in the first island region $I_1$ to produce the $p^+$-type emitter region 14. Similarly, boron (B) ions are selectively implanted into the $p^+$-type base region 12 in the second island region $I_2$ to produce the $n^+$-type emitter region 15.

The contact hole $H_1$ is formed in the boundary between the first and second island regions $I_1$ and $I_2$ over the tungsten interconnection conductor 8 by photolithography and dry etching. The contact hole $H_1$ extends to the interconnection conductor 8 through the mask oxide film 13, the BPSG film 10 and the silicon nitride film 9.

Then, tungsten is selectively grown in the contact hole $H_1$ to produce the tungsten plug or contact conductor 16 therein. The top of the plug 16 exists in substantially the same plane as the surrounding BPSG film 10.

The base openings or holes $H_{11}$ and $H_{21}$ are formed in the mask dioxide film 13 over the base regions 11 and 12, respectively.

Finally, an aluminum (Al) film is formed on the mask dioxide film 13 by sputtering to be patterned. Thus, the base electrodes 17 and 19 are formed over the base regions 11 and 12 to be in contact therewith through the base openings $H_{11}$ and $H_{21}$, and the emitter electrodes 18 and 20 are formed over the emitter regions 14 and 15 to be in contact therewith through the emitter openings $H_{13}$ and $H_{22}$, respectively.

Also, the common collector electrode 21 is formed on the boundary between the first and second island regions $I_1$ and $I_2$ to be in contact with the tungsten plug 16 as the contact conductor.

Thus, the semiconductor device of the first embodiment shown in FIGS. 2A and 2B is obtained.

Second Embodiment

Figure 5A:
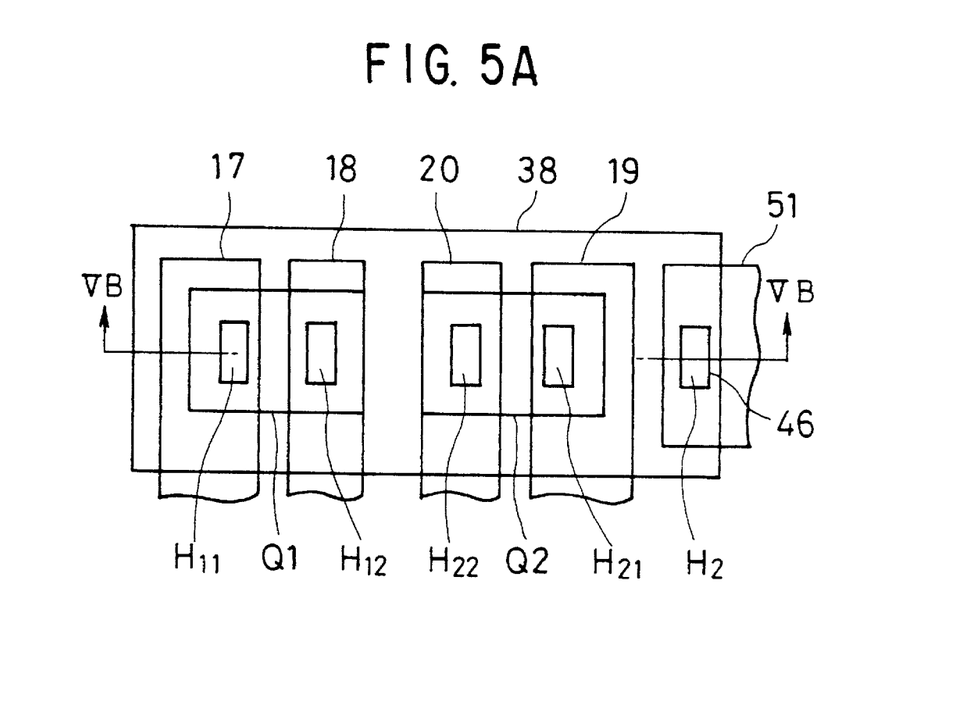
FIG. 5A is a partial plan view of a semiconductor device according to a second embodiment of the invention.
Figure 5B:
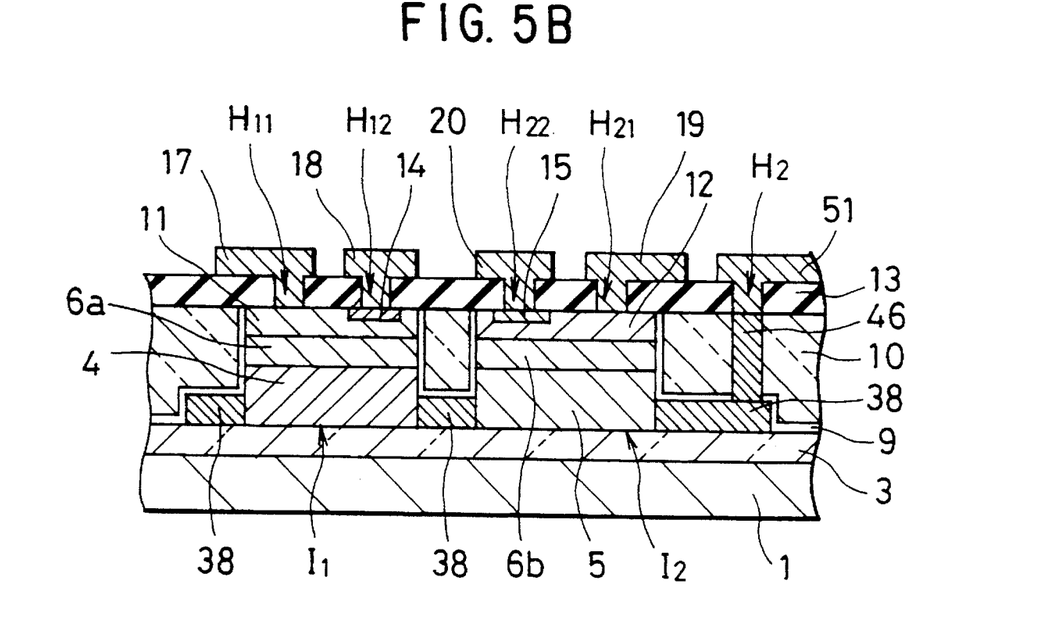
FIG. 5B is a cross section along the line VB—VB in FIG. 5A.

FIGS. 5A and 5B show a semiconductor device according to a second embodiment of the present invention.

Similar to the first embodiment, FIG. 5A shows a plan view of the portion surrounded by the broken line in FIGS. 3A and 3B, and FIG. 5B shows a cross section along the line IIB—IIB in FIG. 2A.

The semiconductor device of the second embodiment has substantially the same structure as that of the first embodiment with the exception that a tungsten interconnection conductor 38 is formed to surround $p^+$-type collector region 4 of the pnp bipolar transistor Q1 and an $n^+$-type collector region 5 of the npn bipolar transistor Q2, and that a common collector electrode 51 is positioned at the right side of the transistor Q2.

With the semiconductor device of the second embodiment, the interconnection conductor 38 is formed not only in the boundary between the first and second island regions $I_1$ and $I_2$ but also in the peripheral area of the island regions $I_1$ and $I_2$. Therefore, the device size or chip occupation area increases slightly compared with that of the first embodiment; however, the collector resistances of the transistors Q1 and Q2 can be reduced because of increased contact areas between the interconnection conductor 38 and the collector regions 4 and 5.

The fabrication method of the semiconductor device of the second embodiment is shown referring to FIGS. 6A to 6D.

Figure 6A:
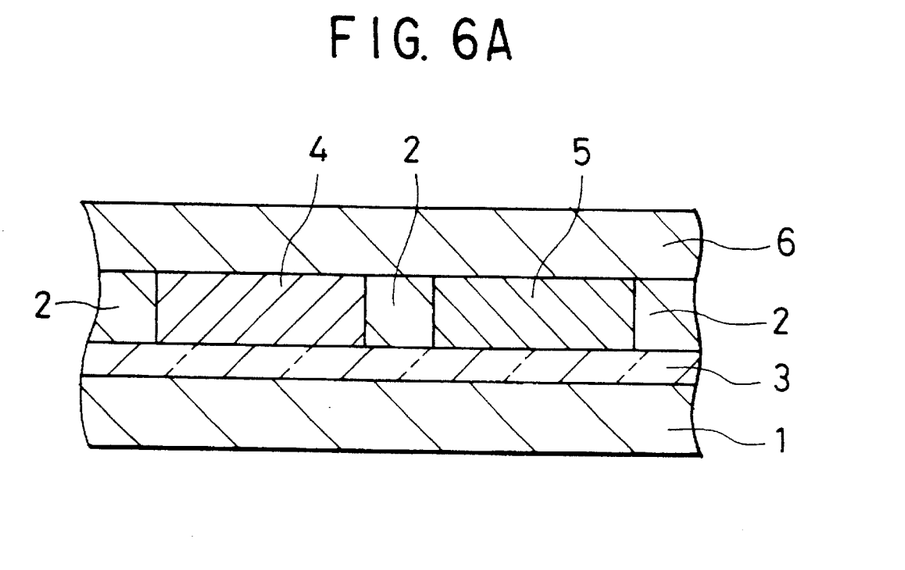
FIG. 6A to 6D are cross sections along the line VB—VB in FIG. 5A showing the fabrication method of the semiconductor device according to the second embodiment of the invention, respectively.

First, in the same way as the first embodiment, the $n^-$-type silicon substrate 2 is coupled with the silicon substrate 1, and then, polished to be about 1.5 μm in thickness. P- and n-type dopant ions are selectively implanted into the substrate 2 to produce the $p_+$-type collector region 4 and $n^+$-type collector region 5 in the substrate 2. An $n^-$-type silicon is epitaxially grown on the substrate 2 to produce an $n^-$-type epitaxial layer 6. The state at this time is shown in FIG. 6A.

Figure 6B:
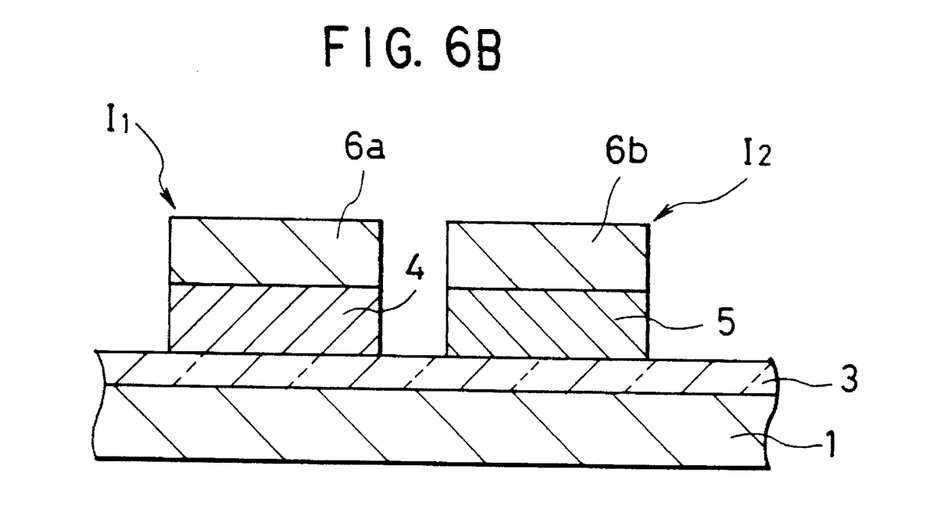

Subsequently, as shown in FIG. 6B, the epitaxial layer 6 and the substrate 2 are selectively etched to form the first and second island regions $I_1$ and $I_2$ on the silicon dioxide film 3 at an interval.

A negative-type photoresist film 52 is formed to cover the island regions $I_1$ and $I_2$ and the silicon dioxide film 3, and is patterned so that the film 52 is selectively removed at the positions where the collector interconnection conductor 38 is formed thereon.

Figure 6C:
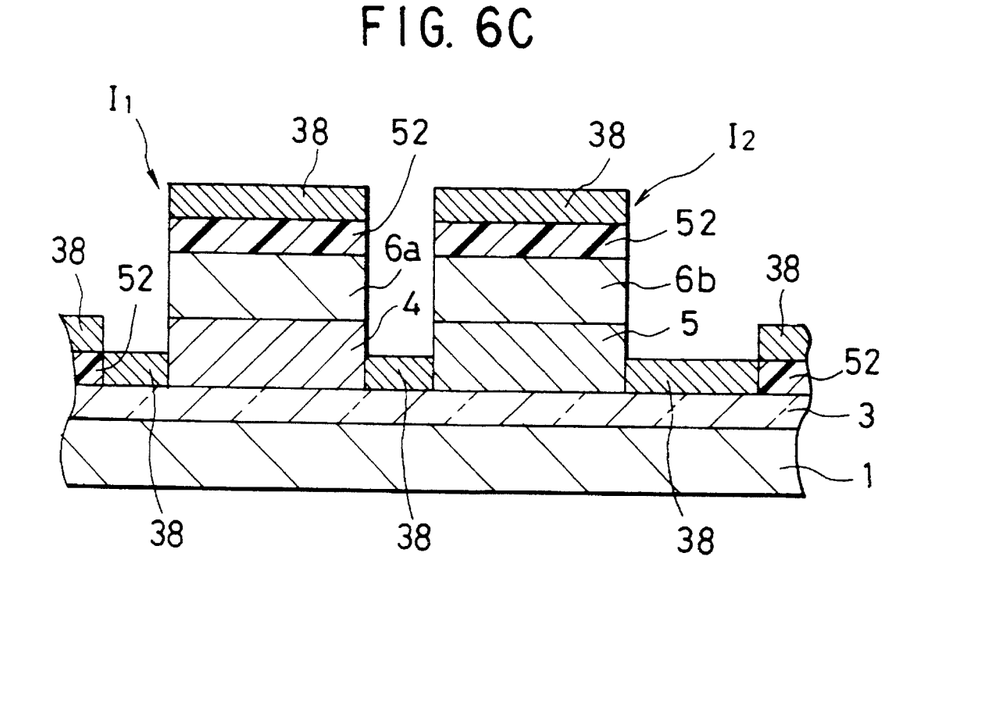

The tungsten film 38 is formed on the patterned photoresist film 52 by sputtering. The state at this time is shown in FIG. 6C.

Figure 6D:
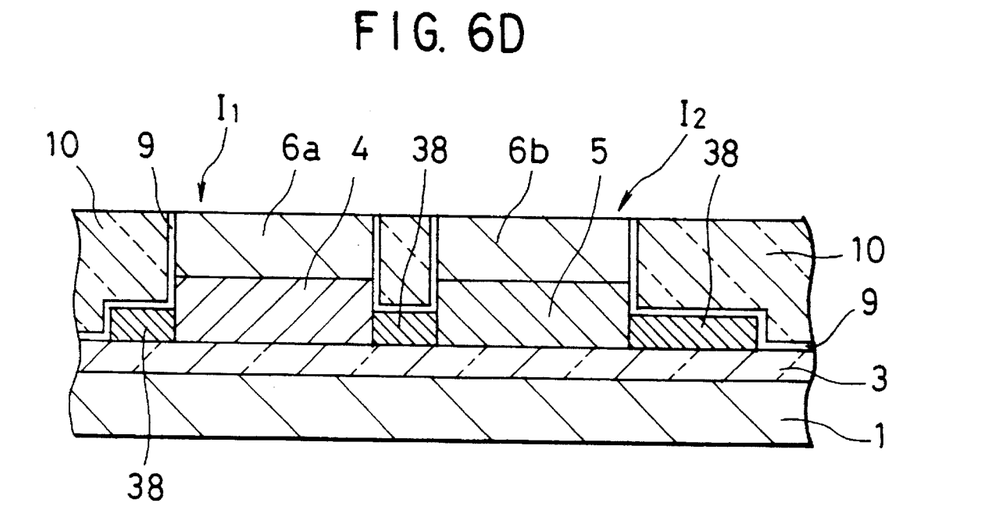

Then, the photoresist film 38 is removed; thus, the tungsten film 38 is selectively removed with the photoresist film 38 so that the tungsten film 38 remains at the space between the first and second island regions $I_1$ and $I_2$ and at the peripheral area thereof (the lift-off method). The remaining tungsten film 38 as shown in FIG. 6D acts as the interconnection conductor.

In this process, any heat-resistant resin or polymer materials such as polyimide may be used as a mask material instead of the photoresist film 38.

Subsequently, similar to the first embodiment, the silicon nitride film 9 is deposited by CVD to cover the entire substrate 1, and the BPSG film 10 is formed on the film 9 so as to bury the island regions $I_1$ and $I_2$ therein. Then, the BPSG film 10 is polished until the silicon nitride film 9 is exposed therefrom at the tops of the island regions $I_1$ and $I_2$. The silicon nitride film 9 thus exposed is selectively removed by etching. The state at this time is shown in FIG. 6D.

Next, in the same way as the first embodiment, the $n^+$- and $p^+$-type base regions 11 and 12 are formed by ion-implantation, the silicon dioxide film 13 for masking is formed by CVD, and the $p^+$- and $n^+$-type emitter regions 14 and 15 are formed by ion-implantation.

A tungsten plug 38 is formed by the same method as the first embodiment at the right side of the transistor Q2.

Then, in the same way as the first embodiment, the base electrodes 17 and 19 are formed over the base regions 11 and 12, the emitter electrodes 18 and 20 are formed over the emitter regions 14 and 15, and the common collector electrode 51 is formed on the peripheral area of the first and second island regions $I_1$ and $I_2$.

Thus, the semiconductor device of the second embodiment shown in FIGS. 5A and 5B is obtained.

Third Embodiment

Figure 7A:
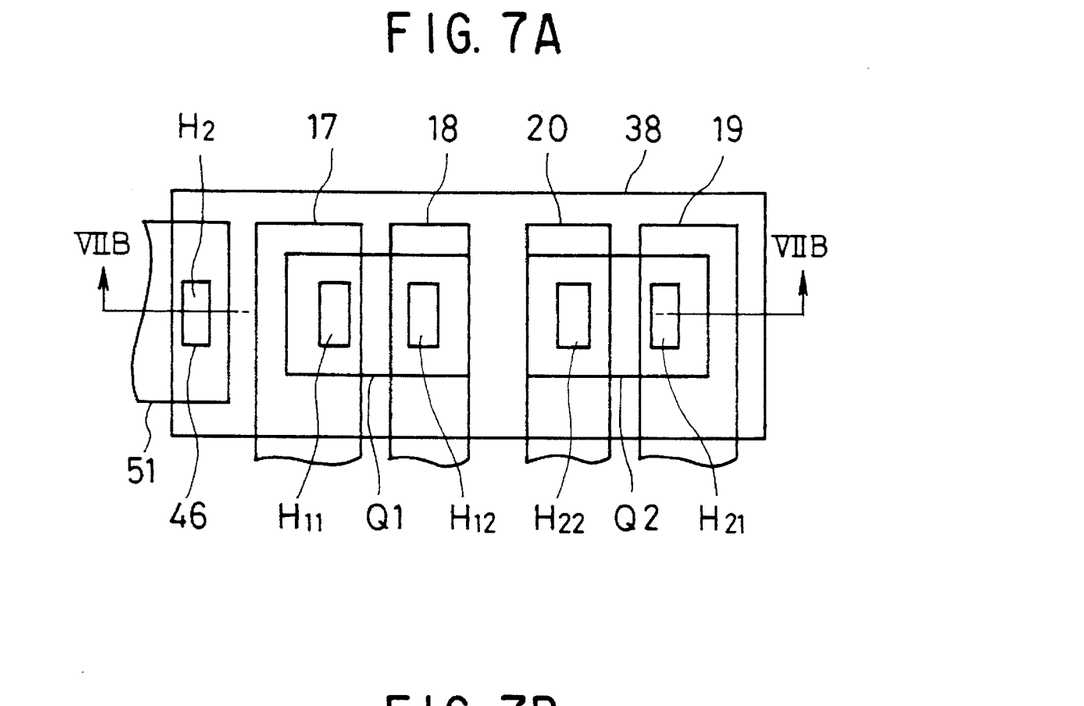
FIG. 7A is a partial plan view of a semiconductor device according to a third embodiment of the invention.
Figure 7B:
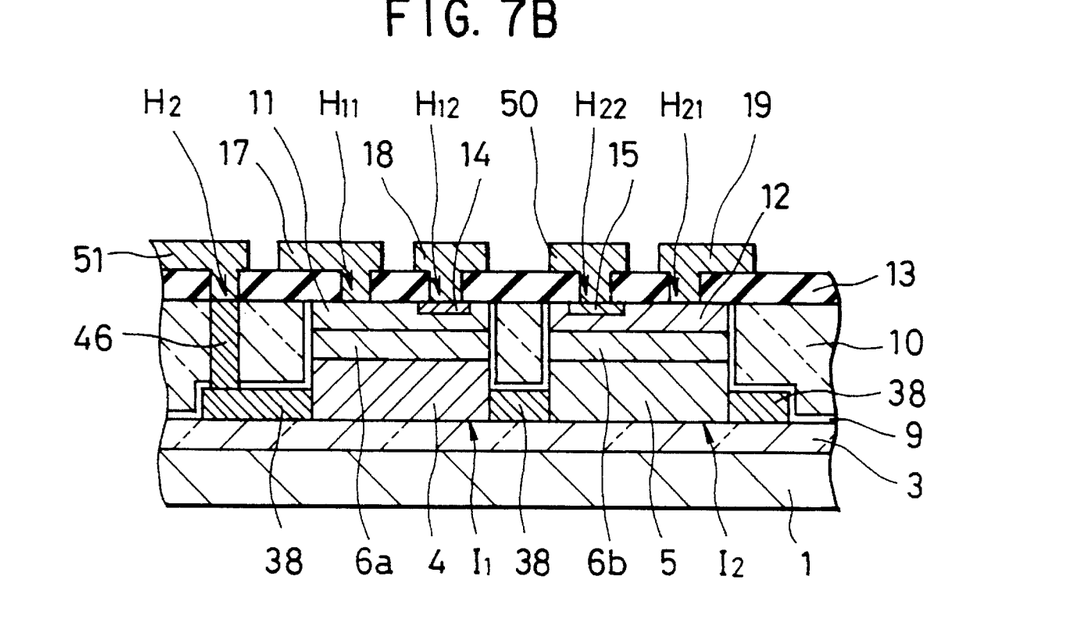
FIG. 7B is a cross section along the line VIIB—VIIB in FIG. 7A.

FIGS. 7A and 7B show a semiconductor device according to a third embodiment of the present invention.

The semiconductor device of the third embodiment has substantially the same structure as that of the second embodiment other than that the common collector electrode 51 is positioned at the left side of the transistor Q1.

It is to be understood from the second and third embodiments that the common collector electrode 51 may be placed at any desired position.

Fourth Embodiment

Figure 8A:
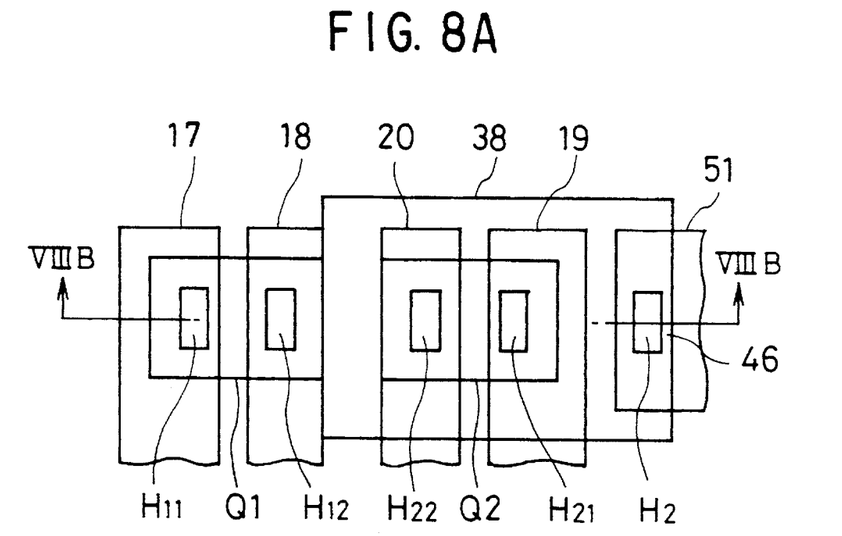
FIG. 8A is a partial plan view of a semiconductor device according to a fourth embodiment of the invention.
Figure 8B:
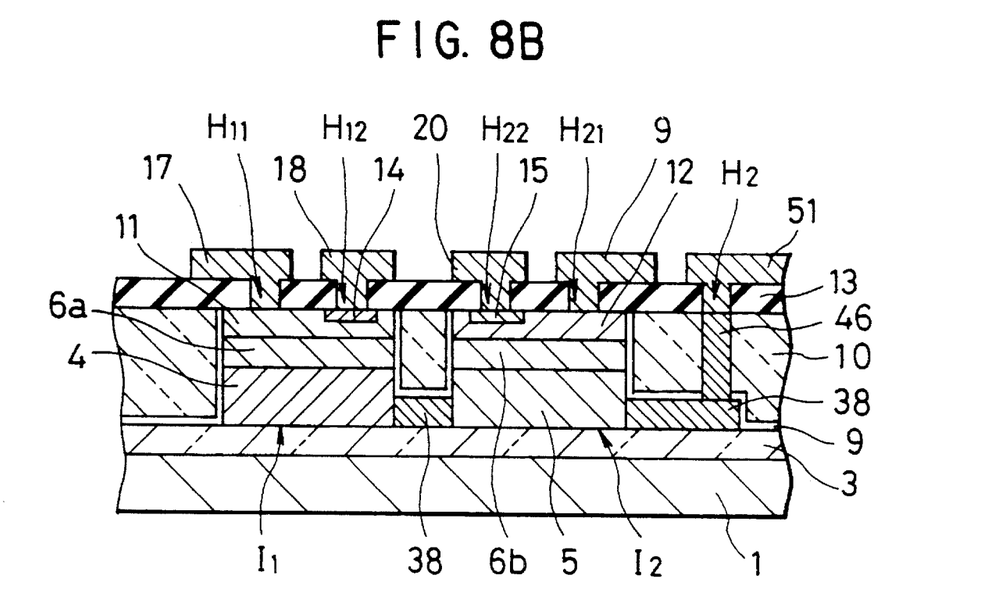
FIG. 8B is a cross section along the line VIIIB—VIIIB in FIG. 8A.

FIGS. 8A and 8B show a semiconductor device according to a fourth embodiment of the present invention.

The semiconductor device of the fourth embodiment has substantially the same structure as that of the second embodiment with the exception that the tungsten interconnection conductor 38 is formed to surround only the second island region $I_2$.

As shown in the second, third and fourth embodiments, the interconnection conductor 38 may be provided to surround one or both of the first and second island regions $I_1$ and $I_2$ as desired.

In the first to fourth embodiments, the first and second bipolar transistors Q1 and Q2 are provided; however, three or more bipolar transistors may be provided.

Also, though the first and second island regions $I_1$ and $I_2$ are formed on the silicon dioxide film 3 provided on the silicon substrate 1 in the above embodiments, any insulating substrates such as a quartz substrate, or a semi-insulating GaAs substrate may be used.

While the preferred forms of the preset invention has been described, it is to be understood that modifications will be apparent to those skilled in the art without departing from the spirit of the invention.

What is claimed is:

1. A semiconductor device comprising:

a first insulator;

a second insulator formed on said first insulator;

a first semiconductor island region and a second semiconductor island region formed to be buried in said second insulator;

a first bipolar transistor provided in said first island region, said first transistor having an emitter region, a base region and a collector region;

a second bipolar transistor provided in said second island region, said second transistor having an emitter region, a base region and a collector region;

an interconnection conductor for electrically interconnecting said collector regions of said first and second transistors;

said interconnection conductor being formed in said second insulator so that it is in contact with said collector regions of said first and second transistors;

a third insulator formed to cover said first and second island regions and said second insulator;

first and second emitter electrodes formed on said third insulator, said first and second emitter electrodes being electrically connected with said emitter regions of said first and second transistors;

first and second base electrodes formed on said third insulator, said first and second base electrodes being electrically connected with said base regions of said first and second transistors; and a common collector electrode formed on said third insulator, said collector electrode being electrically connected with said collector regions of said first and second transistors.

2. The semiconductor device as claimed in claim 1, wherein said interconnection conductor is made of a material selected from the group consisting of refractory metal and refractory metal compound.

3. The semiconductor device as claimed in claim 1, wherein said interconnection conductor is located at a boundary between said first and second island regions.

4. The semiconductor device as claimed in claim 1, wherein said interconnection conductor is formed to surround at least one of said first and second island regions.

5. The semiconductor device as claimed in claim 1, further comprising a contact conductor provided in said second insulator so that it is in contact with said interconnection conductor and said collector electrode, said collector regions being electrically connected with said collector electrode through said interconnection conductor and said contact conductor.

6. The semiconductor device as claimed in claim 5, wherein said contact conductor is made of a material selected from the group consisting of refractory metal and refractory metal compound.

7. The semiconductor device as claimed in claim 5, wherein said common collector electrode and said contact conductor are formed on said third insulator over said first island region so that they are located over a side of said first island region that is opposite a boundary between said first and second island regions.

8. The semiconductor device as claimed in claim 5, wherein said common collector electrode and said contact conductor are formed on said third insulator over said second island region so that they are located over a side of said second island region that is opposite a boundary between said first and second island regions.

9. The semiconductor device as claimed in claim 1, wherein said first insulator is an insulator film formed on a semiconductor substrate.

10. The semiconductor device as claimed in claim 1, wherein one of said first and second bipolar transistors is a pnp-type and the other thereof is an npn-type.

11. The semiconductor device as claimed in claim 1, wherein said common collector electrode is formed on said third insulator over said first island region so that it is located over a side of said first island region that is opposite a boundary between said first and second island regions.

12. The semiconductor device as claimed in claim 1, wherein said common collector electrode is formed on said third insulator over said second island region so that it is located over a side of said second island region that is opposite a boundary between said first and second island regions.

13. A semiconductor device comprising:

a first insulator;

a second insulator formed on said first insulator;

a first semiconductor island region and a second semiconductor island region formed to be buried in said second insulator;

a pnp-type first bipolar transistor provided in said first island region, said first transistor having a p-type emitter region, an n-type base region and a p-type collector region;

an npn-type second bipolar transistor provided in said second island region, said second transistor having an n-type emitter region, a p-type base region and an n-type collector region;

an interconnection conductor for electrically interconnecting said p-type collector region of said first transistor with said n-type collector region of said second transistor;

said interconnection conductor being formed in said second insulator so that it is in contact with said p-type collector region of said first transistor and said n-type collector region of said second transistor;

a third insulator formed to cover said first and second island regions and said second insulator;

first and second emitter electrodes formed on said third insulator, said first and second emitter electrodes being electrically connected with said p-type emitter region of said first transistor and said n-type emitter region of said second transistor;

first and second base electrodes formed on said third insulator, said first and second base electrodes being electrically connected with said n-type base region of said first transistor and said p-type base region of said second transistor; and a common collector electrode formed on said third insulator, said collector electrode being electrically connected with said p-type collector region of said first transistor and said n-type collector region of said second transistor.

14. The semiconductor device as claimed in claim 13, wherein said interconnection conductor is made of a material selected from the group consisting of refractory metal and refractory metal compound.

15. The semiconductor device as claimed in claim 13, wherein said interconnection conductor is located at a boundary between said first and second island regions.

16. The semiconductor device as claimed in claim 13, wherein said interconnection conductor is formed to surround at least one of said first and second island regions.

17. The semiconductor device as claimed in claim 13, further comprising a contact conductor provided in said second insulator so that it is in contact with said interconnection conductor and said collector electrode, said p- and n-type collector regions being electrically connected with said collector electrode through said interconnection conductor and said contact conductor.

18. The semiconductor device as claimed in claim 17, wherein said contact conductor is made of a material selected from the group consisting of refractory metal and refractory metal compound.

19. The semiconductor device as claimed in claim 17, wherein said common collector electrode and said contact conductor are formed on said third insulator over said first island region so that they are located over a side of said first island region that is opposite a boundary between said first and second island regions.

20. The semiconductor device as claimed in claim 17, wherein said common collector electrode and said contact conductor are formed on said third insulator over said second island region so that they are located over a side of said second island region that is opposite a boundary between said first and second island regions.

21. The semiconductor device as claimed in claim 13, wherein said first insulator is an insulator film formed on a semiconductor substrate.

22. The semiconductor device as claimed in claim 13, wherein said common collector electrode is formed on said third insulator over said first island region so that it is located over a side of said first island region that is opposite a boundary between said first and second island regions.

23. The semiconductor device as claimed in claim 13, wherein said common collector electrode is formed on said third insulator over said second island region so that it is located over a side of said second island region that is opposite a boundary between said first and second island regions.

* * * * *